United States Patent [19]

Gordon

[11] Patent Number: 4,855,000
[45] Date of Patent: Aug. 8, 1989

[54] SEALING OXIDIZING ATMOSPHERE AT HIGH TEMPERATURES

[76] Inventor: Roy G. Gordon, Samuels, Gauthier, Stevens & Kohoe, 225 Franklin St., Suite 3300, Boston, Mass. 02110

[21] Appl. No.: 228,053

[22] Filed: Aug. 4, 1988

[51] Int. Cl.[4] ............................................. B32B 31/12
[52] U.S. Cl. ........................................ 156/289; 65/26; 65/60.1; 118/719; 118/733; 156/292; 156/390; 252/13; 252/25; 427/166; 427/255; 427/255.2
[58] Field of Search .................... 65/26, 60.1; 118/719, 118/733; 156/289, 292, 390; 252/13, 25; 427/166, 255, 255.2

[56] References Cited

U.S. PATENT DOCUMENTS

| | | | |
|---|---|---|---|
| Re. 31,883 | 5/1985 | Bovenkerk et al. | 51/295 |
| 4,146,657 | 3/1979 | Gordon | 427/166 X |
| 4,206,252 | 6/1980 | Gordon | 427/255.2 X |
| 4,264,350 | 4/1981 | Thomas | 65/26 |
| 4,271,212 | 6/1981 | Stengle | 427/202 X |
| 4,285,168 | 8/1981 | Scheetz | 51/281 R |
| 4,377,613 | 3/1983 | Gordon | 427/166 X |
| 4,390,562 | 6/1983 | Yanagisawa | 427/11 |
| 4,592,307 | 6/1986 | Jolly | 118/733 X |
| 4,612,217 | 9/1986 | Gordon | 427/166 X |
| 4,680,218 | 7/1987 | Kimura et al. | 427/131 X |
| 4,713,186 | 12/1987 | Kristen et al. | 252/30 |

*Primary Examiner*—Robert A. Dawson
*Attorney, Agent, or Firm*—Samuels, Gauthier, Stevens & Kehoe

[57] ABSTRACT

Boron nitride, in its soft or "graphitic" form is utilized as a high-temperature lubricant in an oxidizing atmosphere. A particular application for the lubricant is on or in flexible, ceramic-fiber side seals on a continuous glass coating apparatus and the moving edges of glass itself, thereby minimizing any flow to or from the reactor of gaseous reactants.

7 Claims, 1 Drawing Sheet

SEALING OXIDIZING ATMOSPHERE AT HIGH TEMPERATURES

BACKGROUND OF THE INVENTION

This invention relates to the provision of a high-temperature lubricant for shields formed of a flexible sheet material. These sheets are used in an oxidizing environment. More specifically, the shields are used on a glass-coating in contact with glass of temperatures as high as 600°–650° C.

The high-temperature coating of glass is well-known and has been described in a large number of publications including U.S. Pat. Nos. 4,377,613; 4,187,336, 4,146,657 and 4,612,217. These Patents are incorporated by reference herein. A problem existed in the equipment, e.g. as described in U.S. Pat. No. 4,612,217, along the sides of the reactor because of small quantities of gas escaping, or entering, through the space between the moving glass and the reactor structure. Such gas movement tended to cause flow variations in the reactor and interfere with achieving the high-degree of steady-state operation which was desired to make optimum products. In practice, although these processes are often carried out in the mildly-reducing environment of a float-glass forming structure, the oxidizing atmosphere of the reactant gases has been found to present a problem in providing suitable seals. Seals used on experimental equipment required replacement with greater frequency than desired. The inventor has set out to remedy that problem.

The use of boron nitride as a lubricant is known in the art. The useful boron nitride to which this invention will be seen to relate, is that form useful as a lubricant which has crystallized in a "soft", "graphite-like", i.e. hexagonal, form. Such boron nitride cleaves in a manner similar to graphite and molybdenum sulfide. (See U.S. Pat. No. Re. 31,883). It is used both in paste form (U.S. Pat. No. 4,713,186) and dry form. It is useful in magnetic recording applications (U.S. Pat. Nos. 4,680,218; and 4,390,562). It has been used in a glass grinding sheet (U.S. Pat. No. 4,555,250). It has been used as a filler in plastics (U.S. Pat. No. 4,285,168) and as a release agent for glass in molding applications (See U.S. Pat. No. 4,264,350 and 4,271,212).

It is noted that the above combination of art relating to boron nitride and processing of glass in an oxidizing atmosphere was enabled only in view of the invention to be described below.

SUMMARY OF THE INVENTION

It is an object of the present invention to provide an improved high-temperature shield for sealing edges of a glass coater used for a process involving a very hot, oxidizing, atmosphere.

Another object of the invention is to provide an improved lubricated shield structure operable at temperatures above 1200° F in an oxidizing atmosphere.

Another object of the invention is to provide an improved process of sealing gases in a glass-coating reactor wherein the seal is made against a continuously-moving glass surface.

Other objects of the invention will be obvious to those skilled in the art upon their reading of this disclosure.

The above objects have been substantially achieved by the coating, or impregnation, of a mineral-fiber sealing strip with a lubricant based on soft boron nitride. The resulting seals are subject to less wear when in contact with moving glass. They are wholly resistant to oxidizing atmosphere of coating reactants and they do not tend to bind on the glass which they contact.

The coating reactor is of the type used in the art for coating a sheet of hot glass with the product of hot gaseous reactants formed in a reaction zone of said reactor. The glass moves through said coating machine, supported on the floating media (or on rollers or other suitable support means should the reaction be outside a float-glass-forming machine). The glass surface being coated effectively forms the bottom of a shallow, but effective, reaction zone formed at the top by the lower portion of the reactor structure and, at the bottom by the glass substrate being coated. The lateral opening between glass and reactor structure above the glass, i.e. the slit-like openings running parallel to the glass movement, are sealed by a mineral-fiber seal strip which is adhesively bonded to the reactor. It carries, on a glass-contacting side, a boron nitride powdered lubricant. The lubricant can be coated on the seal, impregnated, e.g. in a water dispersion into the seal, or otherwise mixed with the ceramic-fibers.

Boron nitride is available from ALFA Products, a division of Morton Thiokol, and is of the graphite-type structure, i.e. formed of thin plate-like hexagonal crystals. This material resists oxidation at temperatures under 1200° C. and even temperatures slightly above 1200° C. In the contemplated use with glass, it commonly encounters temperatures of 600° C., 650° C. or higher. But even these temperatures, in an oxidizing atmosphere, tend to oxidize other conventional lubricants, such as graphite and molybdenum sulfide powder.

The strip-shaped shields can be formed of asbestos or, better, the ceramic-type mineral-fibers of the type now used as asbestos substitutes. For example, among such materials are silica, alumina, and alumino-silicate compositions.

The shields, along each side of the reactor, are typically 174 inch high, 2 feet long and 178 to 1 inch wide. They are formed of commercially available sheets composed primarily of ceramic fibers chosen from the types commonly used to replace asbestos in recent years.

ILLUSTRATIVE EMBODIMENT OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for the purposes of illustration in order that others skilled in the art will more fully understand the invention and the principles thereof and will be able to modify it and embody it in a variety of forms, each as may be best suited to the condition of a particular case.

BRIEF DESCRIPTION OF THE DRAWINGS

Referring to FIG. 1, it is to be noted that the reactor utilizes the glass sheet 14, i.e. the sheet that is to be coated, as the bottom of the reactor. It is to be noted that FIG. 1, being a section of the coating line does not show the seal of the invention, but only indicates the reaction chamber to the edges of which the seal is attached.

Figure 1:
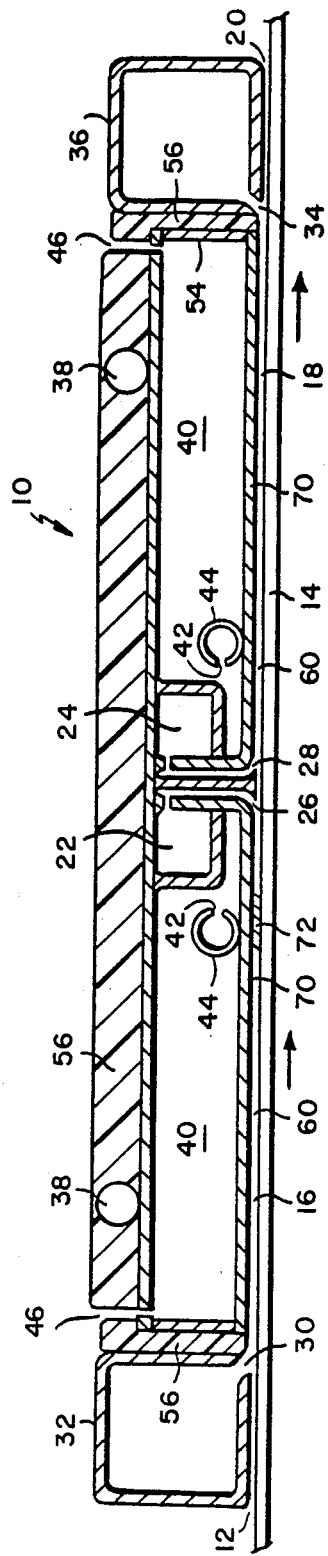
FIG. 1 is an elevation of a glass-coating reactor.

The problem area, i.e. that to be sealed according to the present invention, is the space along the lateral sides of the glass apparatus, i.e. the sides parallel with the glass movement, which is defined by the area 60 in FIG. 1. It is an area which, if left unsealed, can result in an undesirable leakage of gas into, or out of, the reactor zone—thereby upsetting the flow and concentration of reactants along the reaction zones 16 and 18.

Describing the reactor more particularly:

Referring to FIG. 1, it is seen that coating apparatus 10 is arranged to receive a hot glass sheet along a float-glass-type process line.

Apparatus 10, best mounted in a float-glass process housing, comprises an entry port 12 for glass sheet 14, a first coating-reactor zone 16, a second coating-reactor zone 18, and a glass exit port 20. Coating reactor zones 16 and 18 are supplied with a gaseous reaction mixture via gas inlet manifolds 22 and 24, respectively and gas feed orificies 26 and 28 respectively. The reactant mixture supplied via the flowpath comprising manifold 22 and gas feed orifice 26 provides an oxidizing mixture of reactants which flows counter-currently along the glass in zone 16 progressing towards gas outlet port 30 and gas outlet manifold 32.

The reactant mixture supplied via a flowpath comprising manifold 24, and gas feed orifice 28 is a reaction mixture which flows concurrently along the glass in zone 18 progressing towards gas outlet port 34 and gas outlet manifold 36. Each reactant mixture is so selected that it deposits sits a thin coating of the appropriate thickness. The reaction mixtures are selected so that they will be substantially depleted before reaching the outlet or inlet ports.

The overall length of the apparatus from each gas inlet to each gas outlet is conveniently selected to be about 12 inches. The apparatus is suspended from, or mounted on, support port pipes 38. The reaction rates and other reaction zone conditions are substantially improved by maintaining those surfaces of apparatus 10 which are in the reaction zone at a relatively low temperature to inhibit deposition of coating material thereon. Thus, cooling fluid, say nitrogen gas, is fed into each of two cooling chambers 40, each associated with one of reaction zones 14 and 16. The cooling gases enter through ports 42 in cooling supply pipes 44. The gases are removed from the coating apparatus 10 at exit port 46.

The space at each end of the reactor, i.e. proximate the glass at entry port 12 and exit port 20 is narrowed as much as is practical relative to glass sheet 14 to minimize leakage of gas (or entry of gas) at the ends of the reactor. However, when the reactants are properly selected so that they near effective depletion of reactants close to the exit port and entry port, respectively, this sealing is not particularly critical to the process. Thermal insulation 56 helps to maintain the proper temperature for operation of the apparatus by separating the hot gas outlet manifold from the gas cooled housing 54. In practice the apparatus is suitably positioned to provide about 0.25-inch height to the gas flow over the glass substrate. Molten tin, and later, rollers, suport the glass in a float glass process as it moves along the processing line in the manner well-known in the glassmaking industry.

Figure 2:
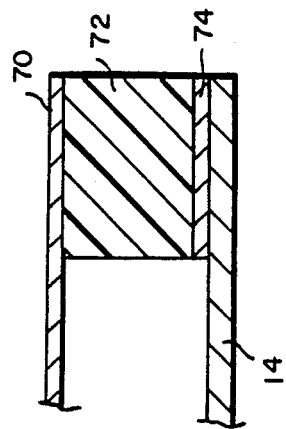
FIG. 2 illustrates the position of a shield on the reactor. A TYPICAL REACTOR

FIG. 2 illustrates how the space 60 between the lateral edges of the lower reactor wall 70 are sealed against glass sheet 14. The shield 72, formed of alumino-silicate, is bonded with adhesives effective at high temperatures such as sauereisen cement on the bottom edge of reactor top wall 70 and has its lubricant-bearing face in contact with the edge of glass sheet 14. The lubricant is identified schematically at 74. In fact, the coating may be used on the surface or impregnated into the surface area of the shield strip.

Boron nitride lubricant withstands temperatures of the process, e.g. temperatures as high as 650° C. or higher, something not achievable with such lubricants as molybdenum disulfide and graphite. Indeed, boron nitride easily resists oxidation at temperatures of up to 1200° C.

The lubricant can be applied to the shield 22 as suspension in water or some other liquid, e.g. mineral oil or the like. The fact that the liquid will disappear means little since it is the residue of boron nitride particles that provides all the lubrication.

It is also to be understood that the following claims are intended to cover all of the generic and specific features of the invention herein described and all statements ments of the scope of the invention which might be said to fall therebetween.

WHAT IS CLAIMED IS:

1. In a glass-coating reactor of the type used to coat glass continuously moving through said reactor within a shallow reaction zone having the glass substrate to be coated as its lower boundary, the improvement wherein;
   (a) a ceramic-fiber seal is provided along each edge of said shallow reaction zone and parallel the moving glass substrate, said seal forming means to prevent movement of gases from said reaction zone;
   (b) and wherein one side of said seal is adhesively bonded to said reactor structure; and
   (c) wherein said seal, on the side of said seal which is adjacent to said substrate, bears a boron-nitride powder lubricant.

2. A coating reactor as defined in claim 1, wherein said lubricant is impregnated into said ceramic-fiber strip.

3. A coating reactor as defined in claim 1 or 2 wherein said ceramic-fiber seal strip is formed of alumino-silicate fibers.

4. A process for sealing lateral opening of a coating machine operating at a high-temperature environment, wherein the lateral openings are formed by a stationary surface and a moving surface, said process comprises the steps of
   (a) bonding a mineral-fiber strip to structure forming a stationary surface of said opening; and
   (b) using a boron nitride lubricant powder at that surface of the mineral fiber strip which is in sealing contact with said moving surface.

5. A process as defined in claim 4 wherein said moving surface is a glass surface and wherein the seal contains an oxidizing environment of hot gases at above 600° C.

6. A process as defined in claim 4 wherein said seal is in an oxidizing environment at above 600° C.

7. A process as defined in claim 4 wherein said seal is exposed to an oxidizing gas at above 650° C.

* * * * *